United States Patent
Bolton et al.

[11] Patent Number: 6,059,567
[45] Date of Patent: *May 9, 2000

[54] SEMICONDUCTOR THERMAL PROCESSOR WITH RECIRCULATING HEATER EXHAUST COOLING SYSTEM

[75] Inventors: Douglas A. Bolton, Orange; Patrick W. Wiesen, Laguna Niguel, both of Calif.

[73] Assignee: Silicon Valley Group, Inc., San Jose, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 09/022,057

[22] Filed: Feb. 10, 1998

[51] Int. Cl.[7] .................................................. F27D 15/02

[52] U.S. Cl. ............................ 432/81; 432/152; 432/241

[58] Field of Search .............................. 432/5, 6, 81, 82, 432/152, 239, 241; 219/391, 402, 403; 134/105

[56] References Cited

U.S. PATENT DOCUMENTS

| | | | |
|---|---|---|---|
| 3,226,254 | 12/1965 | Reuschel | 117/201 |
| 4,062,318 | 12/1977 | Ban et al. | 118/49 |
| 4,263,872 | 4/1981 | Ban | 118/721 |
| 4,339,645 | 7/1982 | Miller | 219/10.49 R |
| 4,363,959 | 12/1982 | Cottrell et al. | 219/532 |
| 4,493,089 | 1/1985 | Abell | 373/130 |
| 4,695,706 | 9/1987 | Mizushina | 219/390 |
| 4,770,590 | 9/1988 | Hugues et al. | 414/172 |
| 4,849,608 | 7/1989 | Muraoka et al. | 219/390 |
| 4,883,424 | 11/1989 | Sakai et al. | 432/77 |
| 4,906,182 | 3/1990 | Moller | 432/77 |
| 4,925,388 | 5/1990 | Iseki et al. | 432/77 |
| 4,926,793 | 5/1990 | Arima et al. | 118/730 |
| 5,038,019 | 8/1991 | McEntire et al. | 219/390 |
| 5,076,206 | 12/1991 | Bailey et al. | 118/724 |
| 5,095,192 | 3/1992 | McEntire et al. | 219/402 |
| 5,097,890 | 3/1992 | Nakao | 165/39 |
| 5,127,365 | 7/1992 | Koyama et al. | 118/724 |
| 5,187,771 | 2/1993 | Uchida | 392/416 |
| 5,229,576 | 7/1993 | Nakao et al. | 219/390 |
| 5,239,614 | 8/1993 | Ueno et al. | 392/416 |
| 5,249,960 | 10/1993 | Monoe | 432/77 |
| 5,320,680 | 6/1994 | Learn et al. | 118/724 |

(List continued on next page.)

FOREIGN PATENT DOCUMENTS

| | | | |
|---|---|---|---|
| 0164928 | 12/1985 | European Pat. Off. | C23C 16/44 |
| 61-114522 | 6/1986 | Japan | G11B 15/10 |
| 61-290713 | 12/1986 | Japan | H01L 21/22 |
| 62-136810 | 6/1987 | Japan | H01L 21/205 |
| 62-245624 | 10/1987 | Japan | H01L 21/205 |
| 1-253229 | 10/1989 | Japan | H01L 21/205 |
| 2-103934 | 4/1990 | Japan | H01L 21/31 |
| 5-006894 | 1/1993 | Japan | H01L 21/324 |
| 96/27897 | 9/1996 | WIPO | H01L 21/00 |

*Primary Examiner*—Teresa Walberg
*Assistant Examiner*—Gregory A. Wilson
*Attorney, Agent, or Firm*—Wilson Sonsini Goodrich & Rosati

[57] ABSTRACT

In summary, the vertical rapid cooling furnace of this invention for treating semiconductor wafers with self contained gas chilling and recycling comprises a hot wall reaction tube positioned within a cylindrical array of heating coils. Space between the hot wall reaction tube and said array of heating coils provides a cooling gas passageway therebetween. The cooling gas passageway has an inlet and an outlet, a chilled gas inlet communicating with the inlet of the cooling gas passageway and a heated gas outlet communicating with the outlet of the cooling gas passageway. The furnace includes a heat exchanger having a hot gas inlet and a chilled gas outlet, the hot gas inlet thereof communicating with said heated gas outlet, and the chilled gas outlet communicating with said cooling gas passageway inlet. With this system, heated gas from the cooling gas passageway can be chilled to remove heat therefrom and returned to the cooling gas passageway to remove heat from the furnace. The furnace preferably includes a fan placed between the chilled gas outlet and the cooling gas passageway inlet and valves for isolating the heat exchanger from the furnace during its heating cycle.

11 Claims, 2 Drawing Sheets

U.S. PATENT DOCUMENTS

| | | | |
|---|---|---|---|
| 5,324,920 | 6/1994 | Nakao | 219/542 |
| 5,346,555 | 9/1994 | Nunotani et al. | 118/724 |
| 5,360,336 | 11/1994 | Monroe | 432/5 |
| 5,443,649 | 8/1995 | Sibley | 118/728 |
| 5,482,558 | 1/1996 | Watanabe et al. | 118/728 |
| 5,506,389 | 4/1996 | Hidano | 219/390 |
| 5,507,639 | 4/1996 | Monoe | 432/77 |
| 5,525,057 | 6/1996 | Monoe | 432/241 |
| 5,536,919 | 7/1996 | Taheri | 219/402 |
| 5,578,232 | 11/1996 | Engelke | 219/532 |
| 5,616,264 | 4/1997 | Nishi et al. | 219/494 |
| 5,618,351 | 4/1997 | Koble, Jr. et al. | 118/728 |
| 5,622,639 | 4/1997 | Kitayama et al. | 219/390 |
| 5,626,680 | 5/1997 | Porter et al. | 118/725 |
| 5,676,869 | 10/1997 | Nakayama et al. | 219/390 |
| 5,679,168 | 10/1997 | Porter et al. | 118/725 |
| 5,763,856 | 6/1998 | Ohkase | 219/390 | ns
SEMICONDUCTOR THERMAL PROCESSOR WITH RECIRCULATING HEATER EXHAUST COOLING SYSTEM

FIELD OF THE INVENTION

This invention relates to an improved thermal processing apparatus and process for heat treatment of semiconductor and glass wafer substrates and the like.

BACKGROUND OF THE INVENTION

Heat treatment devices have been used to form diffusion layers or form silicon oxide or nitride films on semiconductor or glass substrates in the manufacture of electronic devices. These substrates are typically thin wafers made of silicon or other semiconductor materials. The description of the device hereinafter will be provided in reference to wafer substrates, it being understood that the apparatus is equally suitable for treating any thin glass or semiconductor sheets, and treatment of any or all of these materials are considered to be within the scope of this invention.

These devices provide the desired heat treatment by heating the wafers in a reactor or heating chamber while introducing inert or reactive gases into the chamber. These heating chambers are surrounded by heating elements enclosed within an insulated shell. In order to treat large numbers of wafers in a single heat treatment operation, it is conventional to support the wafers, one above the other in a parallel orientation, in a wafer boat. This combination is referred to hereinafter as a wafer stack.

Vertical furnaces generally have the furnace and coaxial wafer boat aligned along a vertical axis. The wafer boat loaded with wafers to be treated is raised into the furnace through a bottom opening before the treatment cycle and lowered from the furnace after treatment. A preferred vertical furnace designed to reduce particulate contaminants by eliminating gas eddy areas in the reaction chamber is described in U.S. Pat. No. 5,320,680.

The prior art furnaces are limited by the ability of their heating systems to rapidly raise and lower furnace temperatures. Japanese patent application publication Hei 4-184923, to Nishimura et al. (Jul. 1, 1992), describes a heat treatment apparatus designed to reduce the heating time. The heating and cooling cycle times for the Nishimura et al. system are limited by the provision of additional heat sink materials to support the wafers, since they increase the power requirements and times for the heating and cooling phases.

Commonly assigned, copending Application Ser. No. 08/827,542 filed Mar. 28, 1997 describes a rapid heating and cooling furnace with wafer boat structures which protect wafers during rapid heating and cooling cycles. This furnace provides a cooling cycle in which air is drawn through the furnace between the outer reaction chamber wall and the heating elements to rapidly remove heat and lower the temperature of the furnace, including the reaction chamber and the wafers. The heated air is removed through the system exhaust. An optional heat exchanger in the exhaust duct is described as an option to lower the exhaust gas temperature and protect thermally vulnerable seals or gaskets in the exhaust system. This system requires the facility in which the furnace will be operated to an adequate supply of cooling gases and an exhaust system suitable for removing the heated air.

OBJECTS AND SUMMARY OF THE INVENTION

It is an object of this invention to provide a fully contained, fast cooling semiconductor thermal processor with a recirculating heater exhaust cooling system which does not require an auxiliary air source or a facility heated air exhaust system.

It is another object of this invention to provide a fully contained, fast cooling semiconductor thermal processor with a recirculating cooling system which does not require any auxiliary cooling system to protect components of the exhaust system of a facility.

In summary, the vertical rapid cooling furnace of this invention for treating semiconductor wafers with self contained gas chilling and recycling comprises a hot wall reaction tube positioned within a cylindrical array of heating coils. Space between the hot wall reaction tube and said array of heating coils provides a cooling gas passageway therebetween. The cooling gas passageway has an inlet and an outlet, a chilled gas inlet communicating with the inlet of the cooling gas passageway and a heated gas outlet communicating with the outlet of the cooling gas passageway. The furnace includes a heat exchanger having a hot gas inlet and a chilled gas outlet, the hot gas inlet thereof communicating with said heated gas outlet, and the chilled gas outlet communicating with said cooling gas passageway inlet. With this system, heated gas from the cooling gas passageway can be chilled to remove heat therefrom and returned to the cooling gas passageway to remove heat from the furnace. The furnace preferably includes a fan placed between the chilled gas outlet and the cooling gas passageway inlet.

Preferably, the heating coils of the furnace are surrounded by a cylindrical tube of insulation, a cooling air supply shell surrounds the insulation and is spaced therefrom to provide a cooling air supply plenum therebetween. A cooling air supply plenum communicates with said chilled gas outlet of said heat exchanger.

Preferably, at least one circulating water temperature regulating coil is positioned in a heat conducting relationship with the exterior surface of the cylindrical tube or shell of insulation to regulate the outer surface temperature of the cylinder of insulation.

Optionally, a cylindrical shell is positioned between the circulating water temperature regulating coil and the cooling air supply shell and is spaced therefrom, the space between the cylindrical shell and the cooling air supply shell comprising the cooling air supply plenum.

An insulating cap is preferably positioned adjacent the top of the cylinder of insulation, the space therebetween comprising the outlet of the cooling gas passageway.

In preferred embodiment of the furnace includes a heat exchanger system enclosed within insulated walls, the heat exchanger system comprising an insulated inlet plenum for receiving heated gas from the cooling gas passageway outlet and a chilled gas outlet plenum. The heat exchanger is positioned for communication with the inlet plenum and with the chilled gas outlet plenum whereby heat in the gases passing from the inlet plenum to the chilled gas outlet plenum is removed by the heat exchanger.

Preferably, a return chilled gas plenum communicates with the chilled gas outlet plenum and the inlet of the cooling gas passageway, and an opening is present between the chilled gas outlet plenum and the return chilled gas plenum. A fan is positioned adjacent to or in communication with the opening for moving gas from the chilled gas outlet plenum to the return chilled gas plenum.

Preferably, at least one heated gas valve is placed between the cooling gas passageway outlet and the heat exchanger, whereby communication between the cooling gas passageway outlet and the heat exchanger can be terminated by closure of the heated gas valve and can be opened by opening the heated gas valve.

Preferably, at least one chilled air first valve is placed between the return chilled gas plenum and the cooling gas passageway inlet, whereby communication between the return chilled gas plenum and the cooling gas passageway inlet can be terminated when the chilled gas valve is closed and communication between the return chilled gas plenum and the cooling gas passageway inlet can be opened when the chilled gas valve is open. Optimally, at least one heated gas valve is also placed between the cooling gas passageway outlet and the heat exchanger, whereby communication between the cooling gas passageway outlet and the heat exchanger can be terminated by closure of the heated gas valve and can be opened by opening the heated gas valve.

In summary, the process of this invention for cooling the vertical rapid cooling furnace described above for treating semiconductor wafers comprises removing heated air from the cooling gas passageway outlet, passing the heated gas through a heat exchanger to form chilled gas, returning the chilled gas to the cooling gas passageway inlet, passing the chilled gas through the cooling gas passageway to remove heat from the furnace, forming heated gas, and returning the heated to the heat exchanger for heat removal therefrom.

DETAILED DESCRIPTION OF THE INVENTION

In the original rapid vertical processor described in copending application Ser. No. 08/827,542 filed Mar. 28, 1997, the upper part of the furnace is connected to a furnace exhaust gas conduit or duct which, in turn, communicates with the central air exhaust system of the facility having an exhaust system. A duct control valve is provided which seals the top of the reactor and terminates the exhaust of cooling gases during the heating and reaction cycle. During the cooling cycle, this duct control valve is opened to permit cooling air to sweep through the reactor, exiting the reactor to enter the exhaust system. The furnace exhaust gas conduit or duct can be provided with a conventional heat exchanger to remove heat from the exhaust during the cooling cycle. This was found necessary for some systems because of the presence of thermally unstable seals or other components in the waste gas ducts.

The rapid vertical processor with the integral recirculating heater element exhaust cooling system of this invention is an improved embodiment suitable for use in facilities which do not have facility waste gas exhaust systems or which have severely limited exhaust capacities, or in facilities where the exhaust system includes thermally unstable, organic polymer components such as seals and gaskets in the exhaust or fan system. It removes heated gases, removes heat therefrom to form chilled gases, and returns the chilled gases to remove heat from the furnace or thermal reactor.

In the descriptions in this application, the gases described for the cooling of the reactor or furnace are interchangeably described as air or gas. Air is generally suitable, but in certain applications, another gas such as nitrogen might be employed, and the invention is intended to include the use of any gas which would be suitable for cooling the system, for being chilled, and for being recycled in as a chilled gas.

Figure 1:
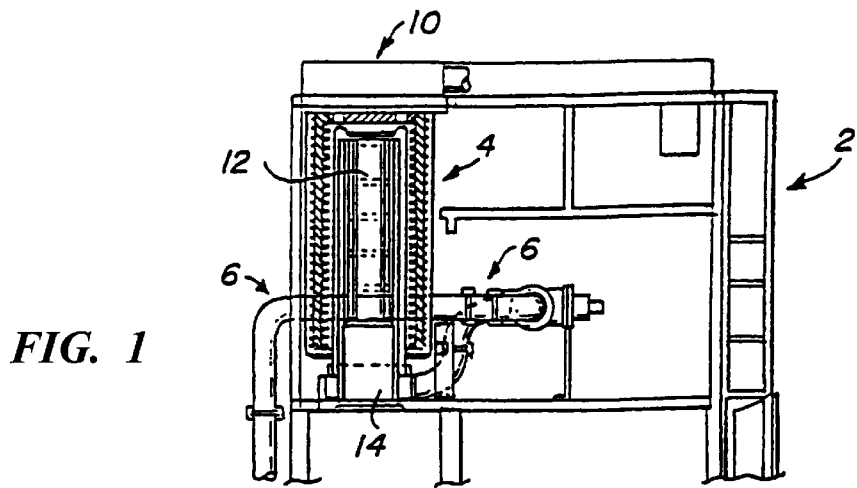
FIG. 1 is a cross-sectional view of a rapid vertical processor with a recirculating heater exhaust cooling system of this invention.

FIG. 1 illustrates a cross-sectional view of a rapid vertical processor with recirculating heater exhaust cooling system of this invention. The vertical reactor cabinet 2 houses the vertical reactor or processor 4 and its controls (not shown). The processor gas inlet conduit 6 removes spent or used processor gases from the furnace. The cabinet surrounding the processor has a cabinet exhaust 10 which removes any leaking reaction gases from the system. The processor 4 houses the wafer boat assembly 12 supported by wafer boat pedestal 14, shown in position for wafer processing.

Figure 2:
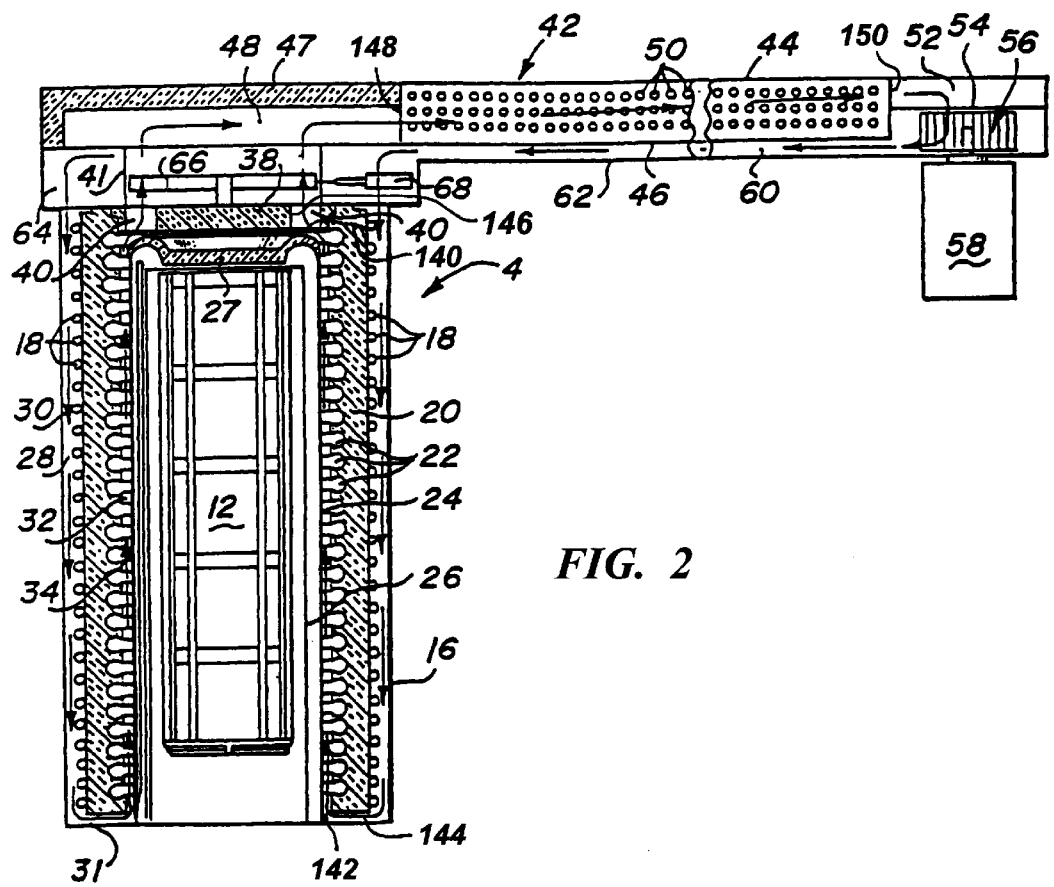
FIG. 2 is a cross-sectional view of the furnace and exhaust cooling system of the rapid vertical processor shown in FIG. 1.

FIG. 2 is a cross-sectional view of portions of the furnace and exhaust cooling system of the rapid vertical processor shown in FIG. 1. The processor is enclosed in a cooling air supply shell 16. Inside shell 16, the processor is surrounded by a circulating water temperature regulating coil 18 which is positioned in a heat conducting relationship with the outer surface of the cylindrical thermal insulating shell, layer or tube 20, designed to maintain a controlled skin temperature for reactor. The interior surface of the thermal insulating shell 20 has annular cavities or receptors 22 for supporting electric resistance heating coils (not shown).

The reaction chamber in which the wafer boat assembly 12 is positioned is enclosed within a double wall quartz isolation enclosure with an outer wall 24, an inner a wall 26 and a reaction chamber top 27, all of which function to direct reaction gas flow around the wafer assembly 12 in the reactor.

The cooling air supply shell 16 and the thermal insulation 20 define a exterior cooling air plenum 28 down which the cooling air passes in the direction shown by arrow 30, chilling the exterior of the insulation. At the bottom of the insulation, the cooling air return 31 directs the air from plenum 28 to the interior cooling air plenum 32 through which the cooling gases flow in the direction of arrow 34, removing heat from the interior of the reactor. The cooing air return 31 is an example of what can more generally be termed a chilled gas inlet 144. The interior cooling air plenum 32 includes and outlet 140 and an inlet 142. The interior cooling air plenum 32 is defined by the space between the outer reaction chamber wall 24 and the interior surface of the cylinder of insulation 20.

Heat radiation and conduction from the interior of the reactor is blocked during processing by the insulating cap 38 through which cooling air outlet holes or ports 40 are positioned to allow exit of the cooling gases passing upward through plenum 32 communicating therewith. The illustrated cooling air outlet holes or ports 40 are an example of what can more generally be termed a heated gas outlet 146. The cooling air flows through exhaust plenum defined by the cylindrical wall 41 (preferably of thermal insulation) to the heat exchanger 42. The heat exchanger 42 includes a hot gas inlet 148 and a chilled gas outlet 150. The hot air exhaust plenum 48 and heat exchanger 42 have an upper wall 44 and a lower wall 46 to direct the air flow through the heat exchanger. The hot air exhaust plenum 48 is defined by the lower wall 46 and thermal insulation layer 47 which prevents escape of heat into the furnace environment.

The hot gases are passed through a conventional heat exchanger 42 with coils 50 provided with a coolant which removes the heat from the hot gases. The chilled air is drawn into the chilled air exhaust plenum 52 through blower inlet opening 54 by the blower wheel 56 driven by the fan motor 58. The blower 56 can be any conventional device for moving air from one compartment to another such as a fan using a propeller or a squirrel cage rotor with vanes, for example. The chilled gas flows from the wheel 56 into the chilled air return plenum 60 defined by the lower heat exchanger wall 46 and the chilled air return plenum wall 62. The chilled air flows into the chilled air supply plenum surrounding the top of the reactor from which it flows into the annular space of the cooling air supply plenum 64. The structure provides communication between each of the successive flow plenums and heat removal areas described hereinabove as the flow path of the cooling air through the system.

The flow through the cooling air ports 40 are controlled by heated gas disc valve 66 which is actuated from the open position wherein the ports 70 therein (FIG. 3) are open to a closed position wherein the ports 70 therein are closed or from the closed to the open position by the disc valve actuator 68 which can be a conventional solenoid or other conventional disc valve actuation system.

Figure 3:
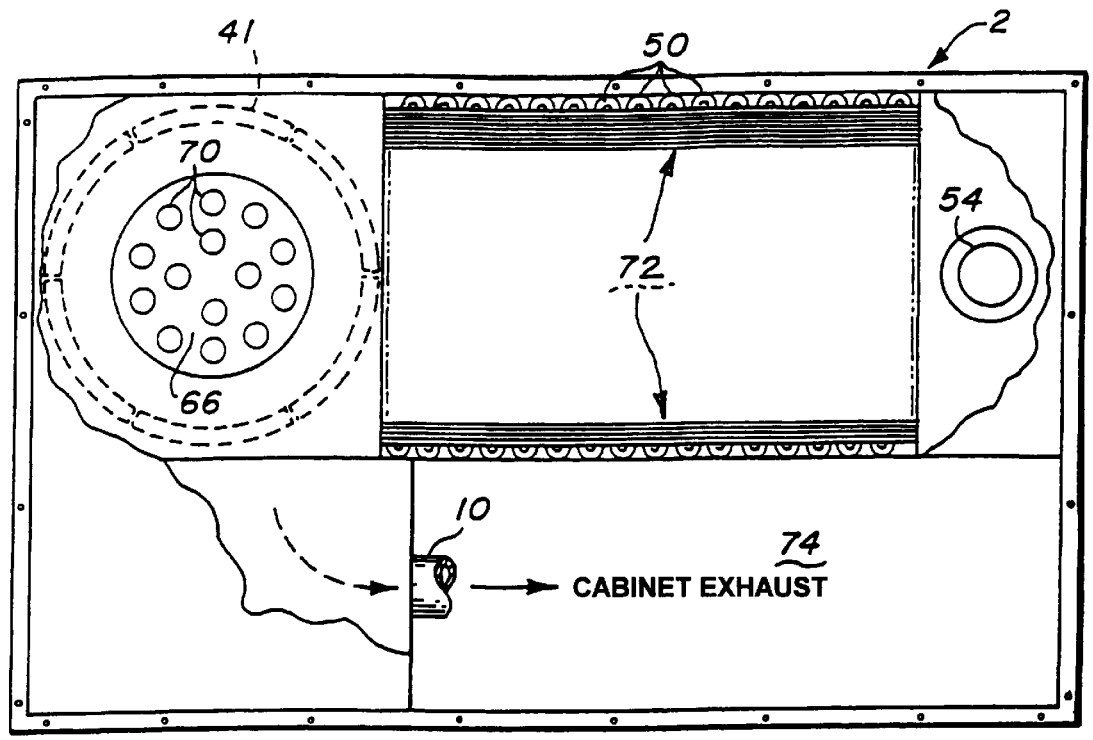
FIG. 3 is a cut-away top view of the recirculating exhaust cooling system shown in FIG. 2.

FIG. 3 is a cut-away top view of the recirculating exhaust cooling system showing the structure of the disc valve structure 66 with the ports 70, the heat exchanger coils 50 and conventional cooling fins 72.

The gases in the cabinet surrounding the reactor are exhausted through conduit 10 into cabinet exhaust plenum 74 from which it is removed to a waste gas exhaust system to dispose of any leakage gases which might enter the cabinet area from the reactor during its operation.

Figure 4:
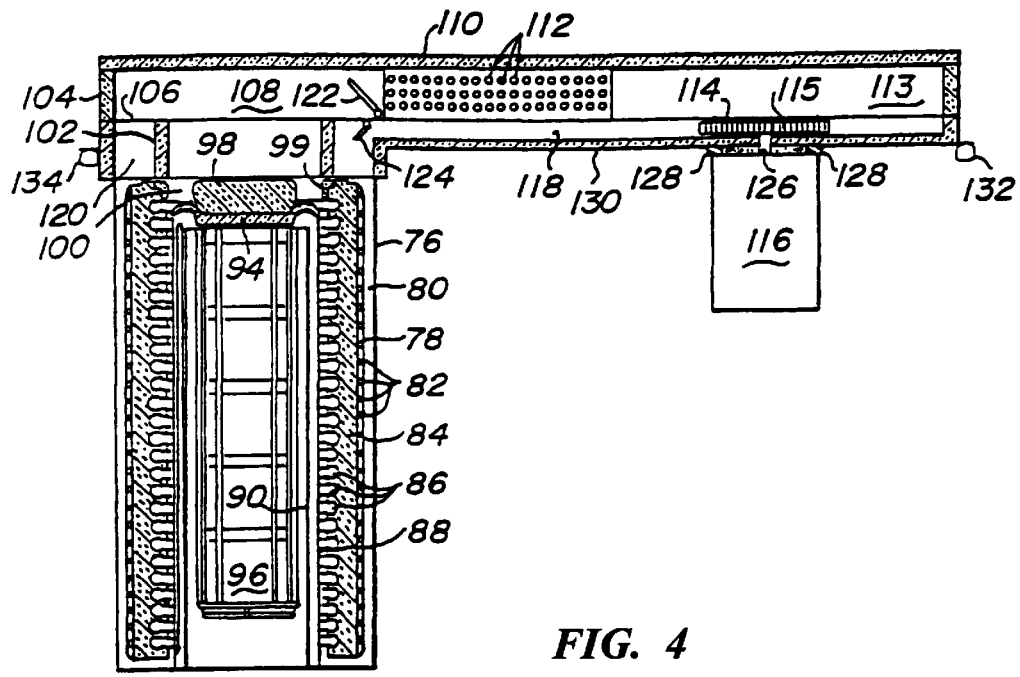
FIG. 4 is a schematic cross-sectional view of an alternative embodiment of a rapid vertical processor with recirculating heater exhaust cooling system of this invention.

FIG. 4 is a schematic cross-sectional view of an alternative embodiment of a rapid vertical processor with recirculating heater exhaust cooling system of this invention. The general assembly is similar to the assembly shown in FIGS. 1–3. The processor furnace and cooling gas assembly is housed in a cabinet (not shown). Surrounding the furnace is a cylindrical outer cooling air supply shell 76. An inner cylindrical shell 78 concentric with outer shell 76 defines a cooling air supply plenum 80 therebetween. Between the inner shell 78 and insulation 84 is a space within which a spiral water cooling coil 82 is housed. As described with respect to FIG. 2, the inner surface of the cylindrical insulation 84 has electric resistance heating coil receptors 86. The reaction chamber is enclosed within a double wall gas flow assembly of quartz or silicon carbide with an outer cylinder wall 88, an inner cylinder wall 90 and reaction chamber top wall 94. A wafer boat 96 is shown in the reaction chamber.

In this embodiment, heat escape from the top of the reaction chamber is blocked by insulating cap 98 which can abut or be closely spaced from the top wall 94. An annular hot gas exit port 100 is defined by the outer circumference or edge of the cap 98 and the annular inner insulating surface 99 supported on the upper extension of the thermal insulating cylinder 84.

An insulating cylinder 102 above the annulus 100 and concentric therewith defines a hot air exhaust passageway leading from the reactor to the cooling gas exhaust plenum 108 defined by insulating shell 104 and lower wall 106. The top wall 110 of the cooling system is lined with insulation. Communicating with the cooling gas exhaust plenum 108 is the heat exchanger 112, which in turn, communicates with the chilled air plenum 113. The chilled air is drawn through an opening in the lower wall 106 through the fan blades 115 and into the chilled air return plenum 118 and from there to the chilled air supply plenum 120 communicating therewith and to the cooling air supply plenum 80.

In this embodiment, closure of the reactor to prevent escape of the gases during the heating phase of the reactor operation and concurrent termination of the cooling gas flow is achieved by closing the hinged heated gas shutter valve 122 and chilled gas shutter valve 124. Shutter valve 122 is positioned in the plenum 108 to close the opening and block the heat exchanger 112 from the plenum 108 in the heating phase and to open to permit hot air exit from plenum 108 during the cooling phase of the reactor operation. Correspondingly, shutter valve 124 is positioned in chilled air supply plenum 118 to block the opening between the plenum 118 and the chilled air supply plenum 120 during the heating phase of the reactor operation and to open to permit flow of cooling air to the plenum 120 from plenum 118 during the cooling phase.

To reduce vibration of the cooling assembly, a ring or blocks of vibrational damping material 128 which can be rubber or similar resilient material are placed around the motor rotor 126, wedged between the motor 116 and the lower wall 130. This partially isolates the motor from the gas cooling assembly. A series of lifting bladders 132 and 134 can be attached between the cooling assembly and the outer cabinet (not shown) to support the cooling assembly above the reaction chamber and to vibrationally isolate the cooling assembly from the furnace. This reduces stress on the furnace casing and other structures and vibrationally isolates the furnace from the motor 116 and the cooling assembly.

It will be readily apparent to a person skilled in the art that numerous modifications and variations of the present invention are possible in light of the above teachings. It is therefore to be understood that within the scope of the appended claims, the invention may be practiced otherwise than as specifically described herein.

The invention claimed is:

1. A vertical rapid cooling furnace for treating semiconductor wafers with self contained gas chilling and recycling comprising:

a hot-wall reaction tube positioned within a cylindrical array of heating coils, spacing between the hot wall reaction tube and said array of heating coils providing an interior cooling air plenum therebetween, the interior cooling air plenum having an inlet and an outlet, a chilled gas inlet communicating with the inlet of the interior cooling air plenum, and a heated gas outlet communicating with the outlet of the interior cooling air plenum, a heat exchanger having a hot gas inlet and a chilled gas outlet, the hot gas inlet communicating with said heated gas outlet, and the chilled gas outlet communicating with said chilled gas inlet, whereby heated gas from the interior cooling air plenum can be chilled to remove heat therefrom and returned to the interior cooling air plenum to remove heat from the vertical rapid cooling furnace.

2. A vertical rapid cooling furnace for treating semiconductor wafers with self contained gas chilling and recycling of claim 1, including a blower placed between the chilled gas outlet and the interior cooling air plenum inlet.

3. A vertical rapid cooling furnace for treating semiconductor wafers with self contained gas chilling and recycling of claim 1 wherein the heating coils are surrounded by a thermal insulating shell, a cooling air supply shell surrounding the thermal insulating shell and spaced therefrom to provide an exterior cooling air plenum therebetween, the exterior cooling air plenum communicating with said chilled gas outlet of said heat exchanger.

4. A vertical rapid cooling furnace for treating semiconductor wafers with self contained gas chilling and recycling of claim 3 wherein at least one circulating water temperature regulating coil is positioned in a heat conducting relationship with an outer surface of the thermal insulating shell to regulate the outer surface temperature of thermal insulating shell.

5. A vertical rapid cooling furnace for treating semiconductor wafers with self contained gas chilling and recycling of claim 3 wherein the thermal insulating shell surrounding the heating coils defines a cylinder and an insulating cap is positioned adjacent the top of the cylinder and spaced therefrom, the space therebetween comprising the heated gas outlet of the interior cooling air plenum.

6. A vertical rapid cooling furnace for treating semiconductor wafers with self contained gas chilling and recycling of claim 1 further comprising a hot air exhaust plenum between the hot wall reaction tube and the heat exchanger for receiving heated gas from the interior cooling air plenum and a chilled air exhaust plenum between the heat exchanger and the hot wall reaction tube for receiving cooled gas from the chilled gas outlet.

7. A vertical rapid cooling furnace for treating semiconductor wafers with self contained gas chilling and recycling of claim 6 including a chilled air return plenum between the chilled air exhaust plenum and the inlet of the interior cooling air plenum.

8. A vertical rapid cooling furnace for treating semiconductor wafers with self contained gas chilling and recycling of claim 6 further comprising at least one chilled gas valve between the chilled air return plenum and the exterior cooling air plenum, whereby communication between the chilled air return plenum and the exterior cooling air plenum can be terminated when the at least one chilled gas valve is closed and communication between the chilled air return plenum and the exterior cooling air plenum can be opened when the at least one chilled gas valve is open.

9. A vertical rapid cooling furnace for treating semiconductor wafers with self contained gas chilling and recycling of claim 6 further comprising at least one heated gas valve between the interior cooling air plenum outlet and the heat exchanger, whereby communication between the interior cooling air plenum outlet and the heat exchanger can be terminated by closure of the at least one heated gas valve and can be opened by opening the at least one heated gas valve.

10. A vertical rapid cooling furnace for treating semiconductor wafers with self contained gas chilling and recycling of claim 9 comprising at least one chilled gas valve between the chilled air return plenum and the exterior cooling air plenum, whereby communication between the chilled air return plenum and the exterior cooling air plenum can be terminated when the at least one chilled gas valve is closed and communication between the chilled air return plenum and the exterior cooling air plenum can be opened when the chilled gas valve is open.

11. A method for cooling a vertical rapid cooling furnace for treating semiconductor wafers, the furnace including a hot wall reaction tube positioned within a cylindrical array of heating coils, spacing between the hot wall reaction tube and said array of heating coils providing an interior cooling air plenum therebetween, the interior cooling air plenum having an inlet and an outlet, a chilled gas inlet communicating with the inlet of the interior cooling air plenum a heated gas outlet communicating with the outlet of the interior cooling air plenum, and a heat exchanger having a hot gas inlet and a chilled gas outlet, the hot gas inlet communicating with said heated gas outlet, and the chilled gas outlet communicating with said chilled gas inlet, the method comprising:

removing heated gas from the outlet of the interior cooling air plenum, passing the heated gas through a heat exchanger to form chilled gas, returning the chilled gas to the inlet of the interior cooling air plenum, passing the chilled gas through the interior cooling air plenum to remove heat from the furnace, thereby forming heated gas, and returning the heated gas to the heat exchanger for heat removal therefrom.

* * * * *